United States Patent [19]

Sugahara et al.

[11] Patent Number: 4,859,614
[45] Date of Patent: Aug. 22, 1989

[54] METHOD FOR MANUFACTURING SEMICONDUCTOR DEVICE WITH LEADS ADHERED TO SUPPORTING INSULATOR SHEET

[75] Inventors: Takehisa Sugahara, Kawasaki; Toyokatu Nakagawa, Aizuwakamatsu; Junichi Yano, Yokohama, all of Japan

[73] Assignee: Fujitsu Limited, Kawasaki, Japan

[21] Appl. No.: 126,514

[22] Filed: Nov. 30, 1987

Related U.S. Application Data

[60] Continuation of Ser. No. 773,781, Sep. 9, 1985, abandoned, which is a division of Ser. No. 437,127, Oct. 28, 1982, abandoned, which is a continuation of Ser. No. 120,092, Feb. 1, 1980, abandoned.

[30] Foreign Application Priority Data

Feb. 19, 1979 [JP] Japan .................................. 54-18115
Mar. 20, 1979 [JP] Japan .................................. 54-33116
Apr. 16, 1979 [JP] Japan .................................. 54-46450

[51] Int. Cl.⁴ .......................................... H01L 23/48
[52] U.S. Cl. ........................................ 437/8; 437/206; 206/330; 357/70; 357/80; 357/81
[58] Field of Search .................. 437/217, 220, 206, 8; 206/330; 357/70, 80, 81; 174/52.6

[56] References Cited

U.S. PATENT DOCUMENTS

| | | | |
|---|---|---|---|
| 3,710,205 | 1/1973 | Swanson | 357/4 |
| 4,049,903 | 9/1977 | Kobler | 437/206 |
| 4,115,837 | 9/1978 | Beall et al. | 361/388 |
| 4,138,691 | 2/1979 | Bonkohara et al. | 357/70 |
| 4,215,359 | 7/1980 | Schermer et al. | 357/70 |
| 4,259,436 | 3/1981 | Tabuchi et al. | 29/576 S |
| 4,554,404 | 11/1985 | Gilder, Jr. et al. | 357/70 |
| 4,600,611 | 7/1986 | Clark | 428/13 |

*Primary Examiner*—Olik Chaudhuri
*Attorney, Agent, or Firm*—Staas & Halsey

[57] ABSTRACT

A semiconductor device comprising: a semiconductor chip; a package for accommodating the chip; groups of leads which are arranged around the perimeter of the package; and strip; insulators, such as plastic films, to each of which one of the groups of leads are adhered. In addition, a method for manufacturing the device, comprising the steps of: preparing a package including a semiconductor chip and having lead frames each of which is composed of leads and a supporting end portion; adhering the lead frames to an insulating sheet such as a plastic film; and clipping off the portions of the insulating sheet to which the supporting end portions are adhered.

12 Claims, 10 Drawing Sheets

Fig. 1

PRIOR ART

Fig. 2

PRIOR ART

Fig. 3

PRIOR ART

Fig. 4

PRIOR ART

METHOD FOR MANUFACTURING SEMICONDUCTOR DEVICE WITH LEADS ADHERED TO SUPPORTING INSULATOR SHEET

This is a continuation of co-pending application U.S. Ser. No. 773,781, filed on Sept. 9, 1985, now abandoned, which is a division of co-pending application U.S. Ser. No. 437,127, filed on Oct. 28, 1982, now abandoned, which itself is a continuation of U.S. Ser. No. 120,092, filed Feb. 1, 1980, now abandoned.

BACKGROUND OF THE INVENTION

The present invention relates generally to a semiconductor device which is accommodated to a flat package and a method for manufacturing the same.

A flat package, called a "flatpack", can be used to encapsulate an LSI (i.e., Large Scale Integrated circuit) chip which has a large number of contact pads. Therefore, the semiconductor device has high density leads, which come out of the sides of the package and are arranged in a plane which is the same as that of the package or parallel with that of the package.

The prior art semiconductor device comprises an LSI chip and a package for accommodating the LSI chip having a large number of contact pads. In order to manufacture such a semiconductor device, a carrier which is already provided with a lead pattern is prepared. Next, lead frames which have leads and a supporting end portion for supporting the leads are brazed to each side of the lead pattern of the carrier. Generally, the leads within one lead frame are elongated and parallel with each other. Then, an LSI chip is bonded to a die bond area of the carrier. After that, the inner leads are bonded to contact pads of the LSI chip by wires, which is a so-called wire bonding. After the wire bonding operation has been completed, a cover is placed on the carrier so that the space in which the LSI chip is located is hermetically enclosed.

In order to test such a semiconductor device whose leads are located at closely spaced points, the ends of the lead frames are clipped off and, after that, the leads of the semiconductor device are brazed to a printed circuit board for testing. The printed circuit board has probe pads at widely spaced points so that probes are easy to mount on the board. After testing, the leads of the semiconductor device are separated from the printed circuit board.

However, in the above-mentioned prior art, the cost for manufacturing a semiconductor device is high, since processes for brazing and separating leads of the semiconductor device on a printed circuit board are required, which is high in cost. In addition, defective devices, such as those with bent leads, are often generated during the brazing and separating processes, so that it is necessary to repair the defective leads. Furthermore, in the electrical testing of the semiconductor device, signal measurement is very slow, since the printed pattern wires of the printed circuit board are relatively long.

SUMMARY OF THE INVENTION

It is an object of the present invention to provide a semiconductor device and a method for manufacturing the same, whose manufacturing cost is low.

It is another object of the present invention to provide a semiconductor device and a method for manufacturing the same, which facilitates easy testing and use of very fast signals in electrical testing.

According to the present invention, there is provided a semiconductor device, comprising: a semiconductor chip; a package for accommodating the semiconductor chip; groups of leds each of which groups are arranged on the perimeter of the package and extend along substantially the same direction; and strip insulators to each of which one of the groups of leads are adhered, whereby the leads are supported by the strip insulators.

According to the present invention, there is also provided a method for manufacturing the above-mentioned semiconductor device, comprising the steps of: preparing a package including a semiconductor chip and having lead frames each of which is composed of leads and a supporting end portion for supporting the leads; adhering the lead frames to an insulating sheet, and; clipping off the portions of the insulating sheet to which the supporting end portions are adhered, whereby the leads are supported by the insulating sheet.

In the present invention, strip insulators or an insulating sheet made of a plastic film which is low in cost is used. In addition, defective leads such as bent leads will not often be generated, which decreases the necessity for repairing the defective leads. Therefore, the manufacturing cost is low. Further, the semiconductor device of the present invention is easy to mount on a testing unit. In testing the semiconductor device, fast signals can be obtained.

The present invention will be more clearly understood from the following description with reference to the accompanying drawings.

BRIEF DESCRIPTION OF THE DRAWINGS

FIGS. 5 through 11 are views illustrating the various steps in the manufacture of an embodiment of the semiconductor device of the present invention.

DETAILED DESCRIPTION OF THE PREFERRED EMBODIMENTS

Figure 1:
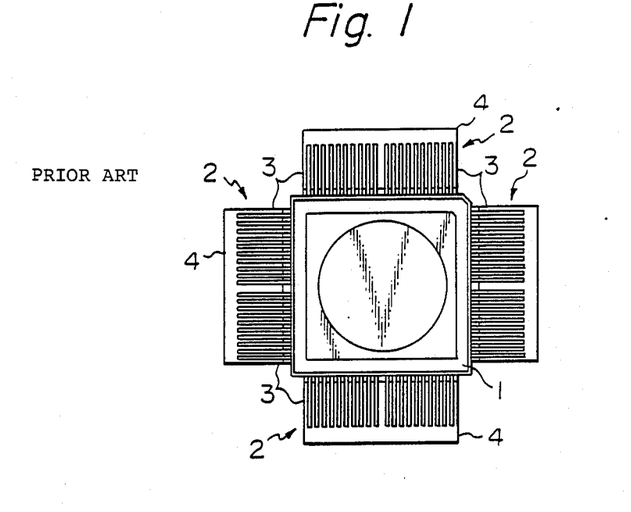
FIGS. 1 through 4 are views illustrating the various steps in the manufacture of a semiconductor device of the prior art.
Figure 2:
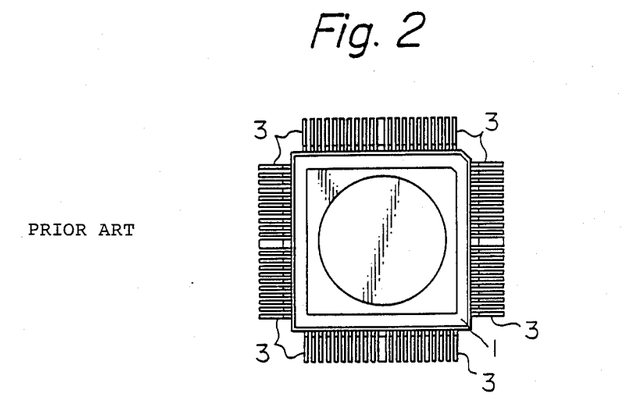

The prior art semiconductor device and the method for manufacturing the same will be explained below. The steps for manufacturing the semiconductor device are shown in FIGS. 1 through 4. In FIG. 1, a package 1 made of a ceramic material comprises a carrier (not shown) including an LSI chip and a cover (not shown) so that the LSI chip is hermetically enclosed. On the perimeter of the package 1, four lead frames 2 are arranged on each side thereof. Each of the lead frames 2 is composed of a large number of leads 3 at closely spaced points and a supporting end portion 4 for supporting the leads 3 so that the leads 3 are prevented from bending. For example, the leads 3 may be spaced at intervals of 0.3 mm and each of them is 0.2 mm in width, 0.08 mm in thickness and 4 to 5 mm in length. Next, the supporting end portions 4 are clipped off by means of a pressing machine, and the result is as illustrated in FIG. 2.

Figure 3:
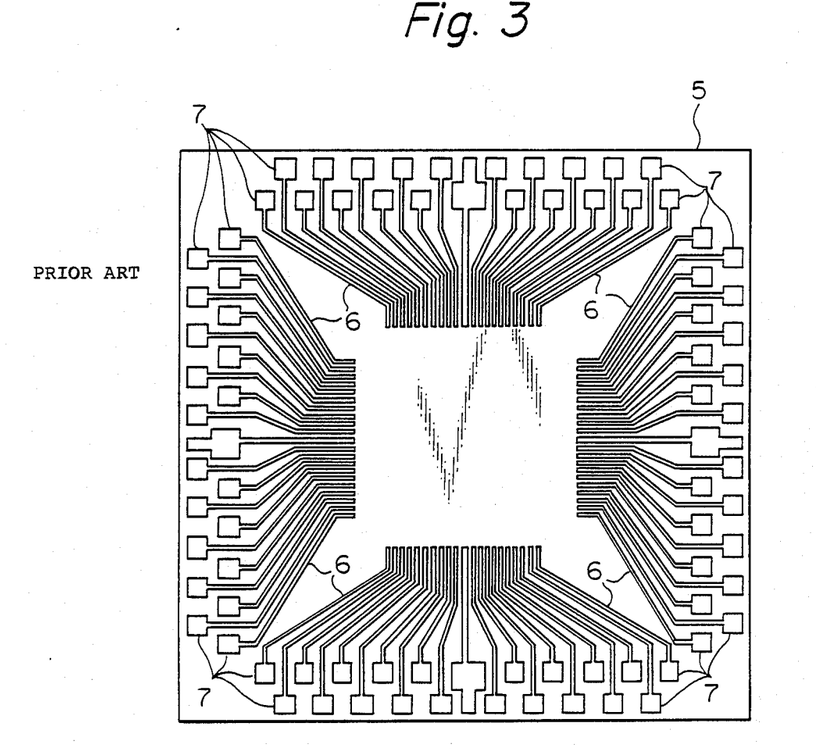
Figure 4:
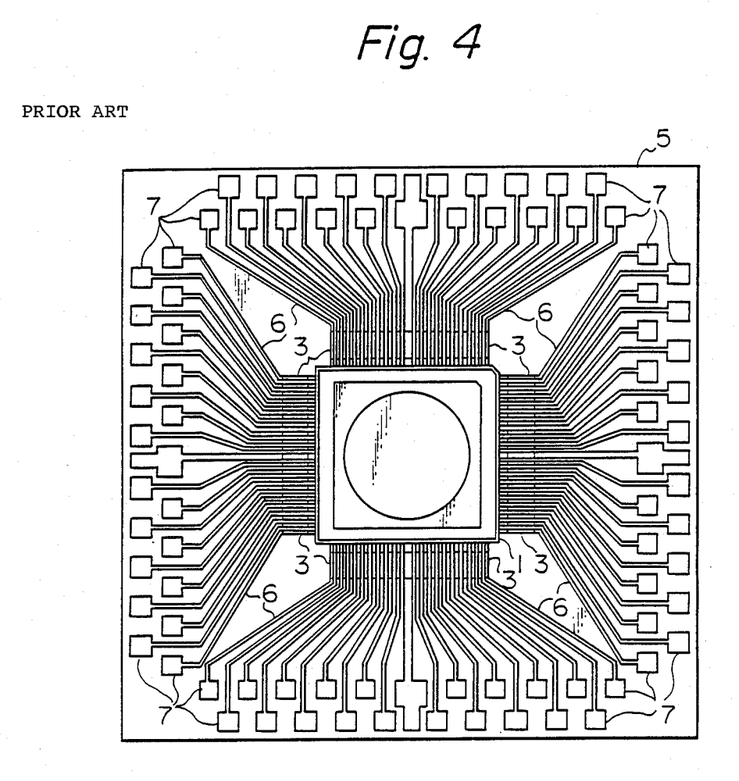

FIG. 3 is a view illustrating a printed circuit board which is used in testing the semiconductor device of FIG. 2. In FIG. 3, the printed circuit board 5 has printed pattern wires 6, whose number is the same as the number of leads 2 of the semiconductor device of FIG. 2, and probe pads 7 at widely spaced positions. The semiconductor device of FIG. 2 is brazed to the printed circuit board 5 in a conventional manner, as illustrated in FIG. 4. After that, testing of the semiconductor device of FIG. 4 is effected by putting probes (not shown) on the probe pads 7. After testing, the semiconductor device of FIG. 4 is separated from the printed circuit board 5.

However, in the prior art semiconductor device as illustrated in FIGS. 1 through 4, the manufacturing cost is high, since processes for brazing and separating the leads 3 of the semiconductor device on the printed circuit board 5, whose manufacturing cost is also high, are required, and, in addition, defective devices such as those with bent leads 3 require repairing. Furthermore, in the testing of the semiconductor device 1, signals are very slow, since the printed pattern wires 6 are relatively long.

Figure 5:
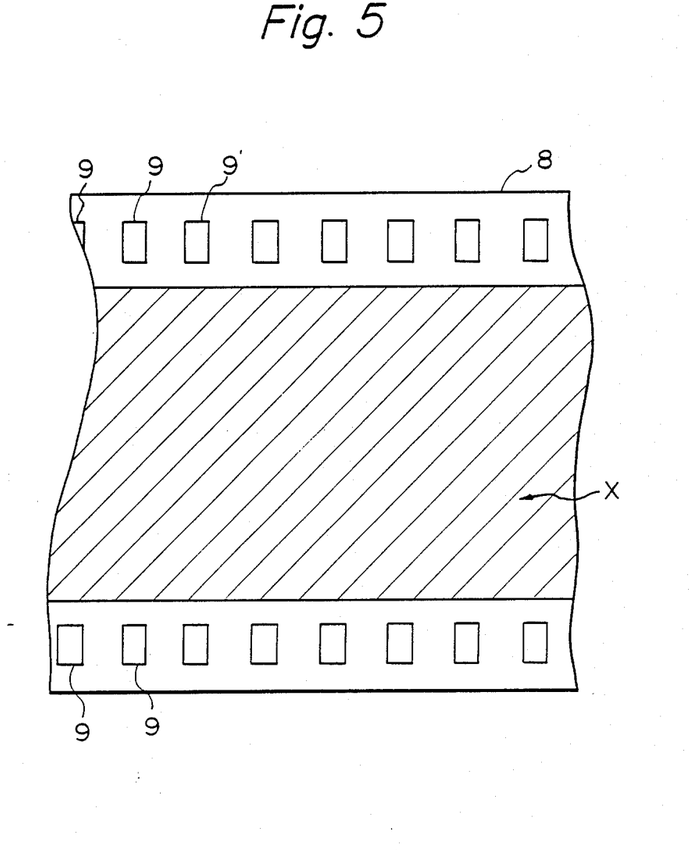

In the present invention, as a means for supporting the leads of the semiconductor device, a plastic film having heat resistivity and excellent insulating properties, such as polyimide, and which is low in cost is used instead of the printed circuit board 5 which is high in cost. Referring to FIG. 5, a plastic film 8 (125 microns in thickness), which is commercially available, is prepared. The plastic film 8 has a series of perforations 9 on both sides thereof. On the shaded portion indicated by an arrow X, an adhesive such as thermosetting epoxy resin is coated. In this case, the coated layer is, for example, about 25 µm in thickness. Then, an opening 12 (shown not in FIG. 5, but in FIG. 7) which is of a size which is substantially larger than the carrier of the package 1 of FIG. 1 is made by means of a conventional perforator.

Figure 6:
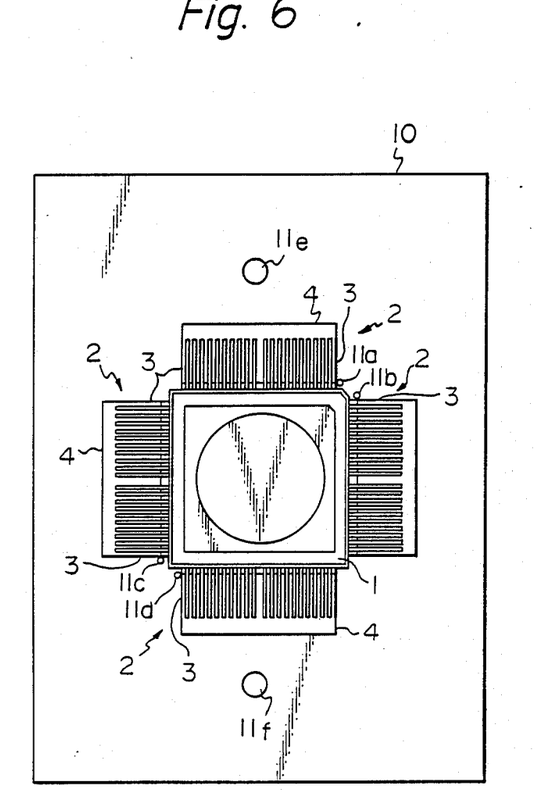
Figure 7:
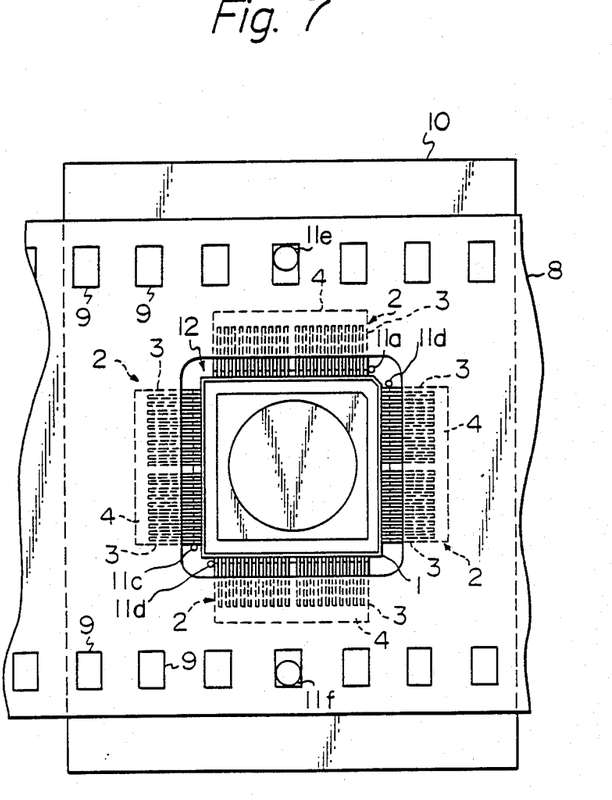
Figure 8A:
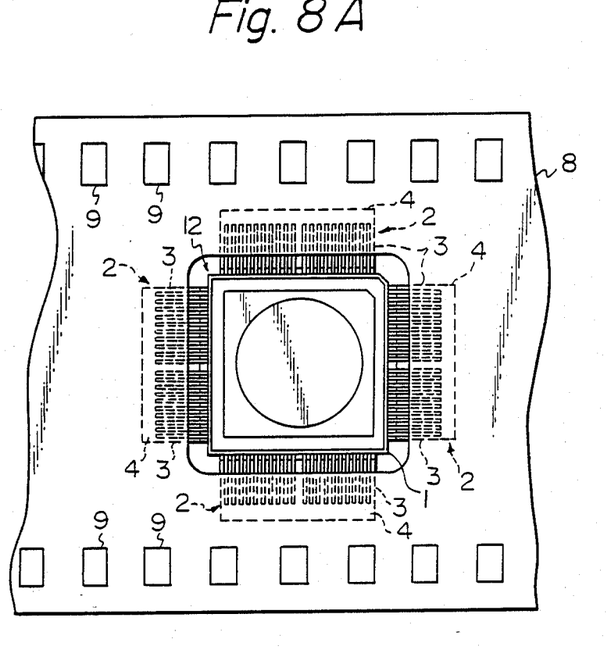
Figure 8B:
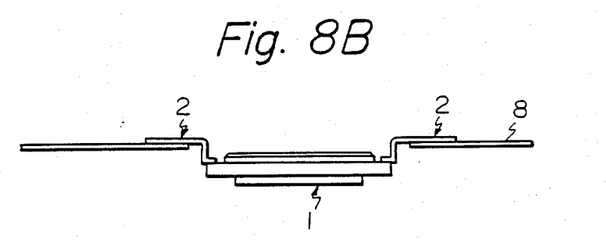

Next, as illustrated in FIG. 6, the semiconductor device which is the same type as that of FIG. 1 is set to a base 10 by guide pins 11a, 11b, 11c and 11d. Then, as illustrated in FIG. 7, the film 8 is set to the base 10 by a pair of guide pins 11e and 11f. In this case, the guide pins 11e and 11f are fitted into one pair of perforations 9. Then, the lead frames 2 are adhered firmly to the film 8 by means of a hot pressing machine and the results is as illustrated in FIGS. 8A and 8B, the latter being an elevation view of FIG. 8A. As shown in FIG. 8B, the leads 3 of the lead frames 2 are formed into an "L"-shaped configuration. However, it should be noted that the leads 3 can be also arranged in the same plane as the flat package.

Figure 9A:
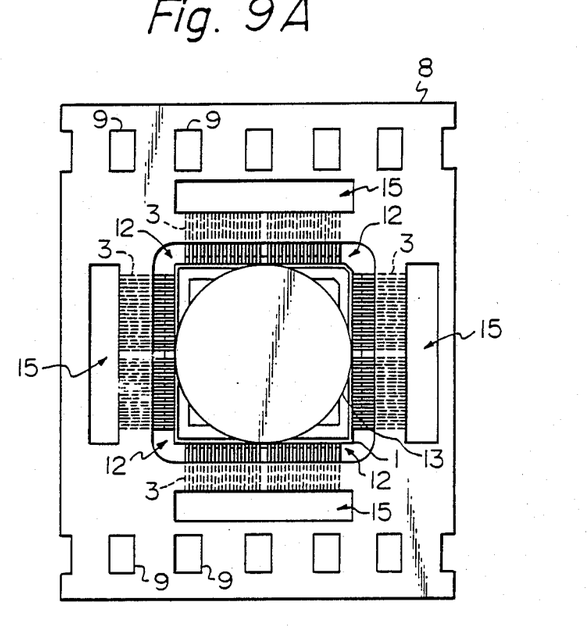
Figure 9B:
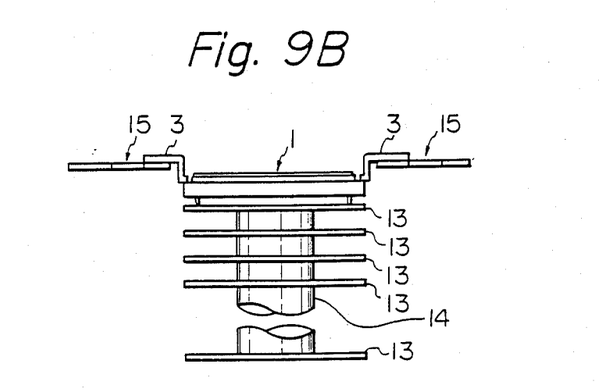

Next, as illustrated in FIGS. 9A and 9B, the latter being an elevation view of FIG. 9A, a cooling assembly, which is composed of one or more cooling fins 13 and a cooling stud 14 for facilitating efficient heat dissipation, are mounted on the package 1. Then, the supporting end portions 4 of the lead frames 2 are clipped off by means of the four apertures 15 which are made in the plastic film 8. Thus, the semiconductor device of the present invention is completed, as illustrated in FIGS. 9A and 9B with the ends of the leads being essentially coincident with the edges of the apertures 15 in the plastic film 8.

Figure 10:
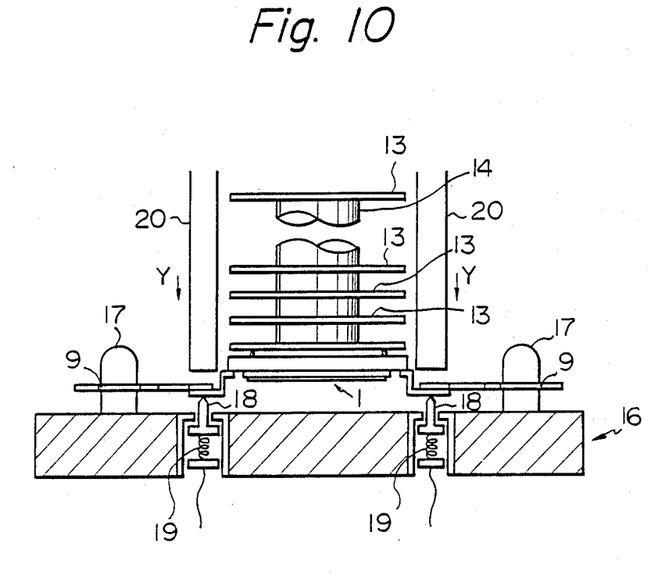

The testing of the completed semiconductor device of FIGS. 9A and 9B will be explained below. Referring to FIG. 10, the semiconductor device 1 is mounted on a testing table 16. The testing table 16 has a pair of guide pins 17, which can be fitted in the perforations 9 of the plastic film 8, and probes 18 connected with springs 19 which are located at positions corresponding to the leads 3. In addition, pushing heads 20 are provided in the table 16. Therefore, the pushing heads 20 are let down as indicated by arrows Y so that the leads 3 come into contact with the probes 18 efficiently.

Figure 11:
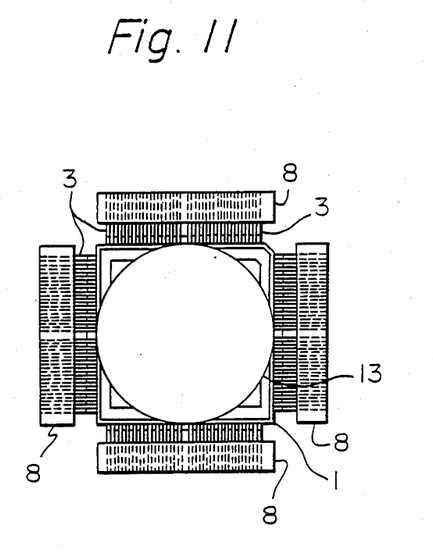

If all the testing of the semiconductor device of FIGS. 9A and 9B is satisfactory, the semiconductor device is clipped off as illustrated in FIG. 11. After that, the film-clipped semiconductor device is mounted on a printed circuit board.

It should be noted that other materials such as papers or non-woven fabrics formed from glass fibers and resinous materials which have heat resistivity and excellent insulating properties can be used instead of the plastic film 8. In addition, the distances between the measuring probes 18 and the package 1 in FIG. 10 are much shorter than the distances between the measuring probes (not shown) which correspond to the pads 7 in FIG. 4. This means that much faster signals can be obtained by the semiconductor device of the present invention.

As explained hereinbefore, the semiconductor device amd the method for manufacturing the same according to the present invention has the following advantages as compared with those of the prior art.

(a) The manufacturing cost is low, because a plastic film which is low in cost is used instead of the printed circuit board of the prior art which is high in cost and, in addition, the number of defective leads, such as leads that become bent, are smaller than the prior art so that the number of defective leads needing to be repaired is also smaller.

(b) Easier testing of the semiconductor device and faster signals in electrical testing than the prior art can be obtained, since the semiconductor device is easy to mount on a testing unit and the distances between the probes and the package are short.

What is claimed is:

1. A method for manufacturing a semiconductor device, comprising the steps of:
    preparing a package containing a semiconductor chip and having one-piece lead frames made of a single type of electrically conductive material, each said lead frame comprising:
        a supporting end portion; and
        plural leads, each of said leads having two ends, one end of each lead coupled to said semiconductor chip and the other end of each lead coupled to each other via said supporting end portion for supporting said leads;
    adhering said supporting end portion of each of said lead frames and a part of each of said leads to an insulating sheet; and
    clipping off portions of said insulating sheet and said supporting end portion of each of said lead frames adhering thereto, leaving said leads supported by said parts thereof adhering to said insulating sheet.

2. A method for manufacturing and testing semiconductor devices, comprising the steps of:
    preparing a package containing a semiconductor chip and having one-piece lead frames made of a single type of electrically conductive material, each said lead frames comprising:
        a supporting end portion; and
        plural leads, each of said leads having two ends, one end of each lead coupled to said semiconductor chip and the other end of each lead coupled to each other via said supporting end portion for supporting said leads;

adhering said supporting end portion of each of said lead frames and a part of each of said leads to an insulating sheet;

clipping off portions of said insulating sheet to which said supporting end portion of each of said lead frames are adhered, along with said supporting end portion, wherein said leads remain supported by said parts thereof adhering to said insulating sheet; and testing and semiconductor device by contacting measuring probes to said leads supported by said insulating sheet.

3. A method as set forth in claim 1 or 2, further comprising the step of attaching a cooling fin assembly to said package.

4. A method as set forth in claim 1 or 2, wherein said leads are "L"-shaped.

5. A method as set forth in claim 1 or 2, wherein said insulating sheet comprises a plastic film.

6. A method as set forth in claim 1 or 2, wherein said insulating sheet comprises paper.

7. A method as set forth in claim 1 or 2, wherein said insulating sheet comprises a non-woven fabric formed from glass fibers and at least one resinous material.

8. The method of claim 2, wherein said clipping off of said portions of said insulating sheet results in a plurality of holes in said insulating sheet, each corresponding to a respective group of said leads, and said leads of said package are aligned for said testing by means including further holes provided in said insulating sheet.

9. The method of claim 8, wherein said adhering of said lead frames to said insulating sheet involves located said package in an opening in said insulating sheet.

10. The method of claim 9, comprising further clipping said insulating sheet after said testing, to leave a respective portion of said insulating sheet adhering to and supporting each said group of leads.

11. The method of claim 10, comprising mounting said package on a printed circuit board after said further clipping.

12. The method of claim 9, 10 or 11, wherein said contacting of said measuring probes to said leads occurs in the vicinity of the edge of said opening in said insulating sheet.

* * * * *

UNITED STATES PATENT AND TRADEMARK OFFICE
CERTIFICATE OF CORRECTION

PATENT NO. : 4,859,614
DATED : August 22, 1989
INVENTOR(S) : Takehisa Sugara et al.

It is certified that error appears in the above-identified patent and that said Letters Patent is hereby corrected as shown below:

Col. 5, line 11, "and" should be --said--.

Signed and Sealed this

Twelfth Day of June, 1990

Attest:

HARRY F. MANBECK, JR.

*Attesting Officer*　　　　*Commissioner of Patents and Trademarks*